US009754844B2

(12) United States Patent
Lee

(10) Patent No.: US 9,754,844 B2
(45) Date of Patent: Sep. 5, 2017

(54) DOUBLE SIDED NMOS/PMOS STRUCTURE AND METHODS OF FORMING THE SAME

(71) Applicant: Taiwan Semiconductor Manufacturing Company, Ltd., Hsin-Chu (TW)

(72) Inventor: Jam-Wem Lee, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/878,312

(22) Filed: Oct. 8, 2015

(65) Prior Publication Data
US 2016/0027704 A1 Jan. 28, 2016

Related U.S. Application Data

(62) Division of application No. 14/044,643, filed on Oct. 2, 2013, now Pat. No. 9,165,829.

(51) Int. Cl.
| | |
|---|---|
| *H01L 21/84* | (2006.01) |
| *H01L 21/768* | (2006.01) |
| *H01L 27/06* | (2006.01) |
| *H01L 21/265* | (2006.01) |
| *H01L 21/762* | (2006.01) |
| *H01L 25/065* | (2006.01) |

(Continued)

(52) U.S. Cl.
CPC ........ *H01L 21/84* (2013.01); *H01L 21/26506* (2013.01); *H01L 21/76254* (2013.01); *H01L 21/76898* (2013.01); *H01L 25/0657* (2013.01); *H01L 25/50* (2013.01); *H01L 27/0688* (2013.01); *H01L 27/0694* (2013.01); *H01L 29/045* (2013.01); *H01L 2225/06541* (2013.01); *H01L 2924/0002* (2013.01)

(58) Field of Classification Search
CPC ............... H01L 21/84; H01L 21/26506; H01L 25/0657; H01L 29/045; H01L 25/50; H01L 21/76254; H01L 27/0688; H01L 27/0694; H01L 21/76898; H01L 2924/0002; H01L 2225/06541; H01L 27/092
USPC .......... 257/374, 74, 758, 255, 369; 438/118, 438/458, 484, 667
See application file for complete search history.

(56) References Cited

U.S. PATENT DOCUMENTS

| | | | |
|---|---|---|---|
| 2005/0202600 A1 | 9/2005 | Yamashita | |
| 2005/0286287 A1* | 12/2005 | Park .................... | G11C 11/5621 365/63 |

(Continued)

*Primary Examiner* — Marc Armand
*Assistant Examiner* — Sue Tang
(74) *Attorney, Agent, or Firm* — Slater Matsil, LLP

(57) ABSTRACT

A chip includes a dielectric layer having a top surface and a bottom surface, a first semiconductor layer overlying and bonded to the top surface of the dielectric layer, and a first Metal Oxide-Semiconductor (MOS) transistor of a first conductivity type. The first MOS transistor includes a first gate dielectric overlying and contacting the first semiconductor layer, and a first gate electrode overlying the first gate dielectric. A second semiconductor layer is underlying and bonded to the bottom surface of the dielectric layer. A second MOS transistor of a second conductivity type opposite to the first conductivity type includes a second gate dielectric underlying and contacting the second semiconductor layer, and a second gate electrode underlying the second gate dielectric.

20 Claims, 10 Drawing Sheets

(51) Int. Cl.
*H01L 25/00* (2006.01)
*H01L 29/04* (2006.01)

(56) References Cited

U.S. PATENT DOCUMENTS

| | | | | |
|---|---|---|---|---|
| 2007/0105320 A1* | 5/2007 | Yang | ............... | H01L 21/76275 |
| | | | | 438/268 |
| 2008/0272434 A1* | 11/2008 | Park | ............... | H01L 27/115 |
| | | | | 257/347 |
| 2008/0286952 A1* | 11/2008 | Miyairi | ............... | H01L 21/76254 |
| | | | | 438/517 |
| 2011/0092030 A1 | 4/2011 | Or-Bach et al. | | |

\* cited by examiner

DOUBLE SIDED NMOS/PMOS STRUCTURE AND METHODS OF FORMING THE SAME

PRIORITY CLAIM AND CROSS-REFERENCE

This application is a divisional of U.S. patent application Ser. No. 14/044,643, entitled "Double Sided NMOS/PMOS Structure and Methods of Forming the Same," filed on Oct. 2, 2013, which application is incorporated herein by reference.

BACKGROUND

In present semiconductor technology, Complementary Metal-Oxide Semiconductor (CMOS) devices, such as n-type Metal oxide Semiconductor (MOS) transistors and p-type MOS transistors, are typically fabricated on semiconductor wafers. The semiconductor wafers are typically silicon wafers. Most of today's semiconductor devices are built on silicon substrates having a (100) crystal orientation, which substrates are referred to as (100) substrates.

Electrons are known to have high mobility in silicon substrate having a (100) silicon crystal orientation, and holes are known to have high mobility in silicon substrate having a (110) crystal orientation. Typically, the electron mobility in a (100) silicon substrate is roughly two times to about four times higher than the hole mobility values in the same substrate. On the other hand, the hole mobility in a (110) silicon substrate is about two times higher than that in a (100) silicon substrate. Therefore, the p-type MOS transistors formed on a (110) surface will exhibit significantly higher drive currents than the p-type MOS transistors formed on a (100) surface. Unfortunately, the electron mobility on (110) surfaces are significantly degraded compared to that on (100) surfaces.

In addition, p-type MOS transistors and n-type MOS transistors have different preferences regarding the strains. The performance of a MOS transistor can be enhanced through a stressed-surface channel. This technique allows the performance of a MOS transistor to be improved at a constant gate length, without adding complexity to circuit fabrication or design. Research has revealed that a tensile stress in the channel-length direction can improve the performance of n-type MOS transistors, and a compressive stress in channel length-direction can improve the performance of p-type MOS transistors.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

A package with a chip that includes P-type Metal-Oxide Semiconductor (PMOS) transistors and N-type Metal-Oxide Semiconductor (NMOS) transistors and the method of forming the same are provided in accordance with various exemplary embodiments. The intermediate stages of forming the package are illustrated. The variations of the embodiments are discussed. Throughout the various views and illustrative embodiments, like reference numbers are used to designate like elements.

Figure 1:
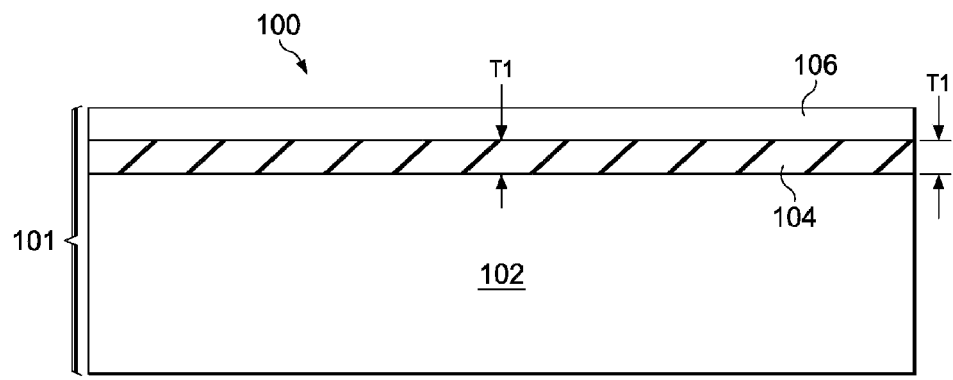
FIGS. 1 through 8 are cross-sectional views of intermediate stages in the manufacturing of a first chip/wafer in accordance with some exemplary embodiments.
Figure 13:
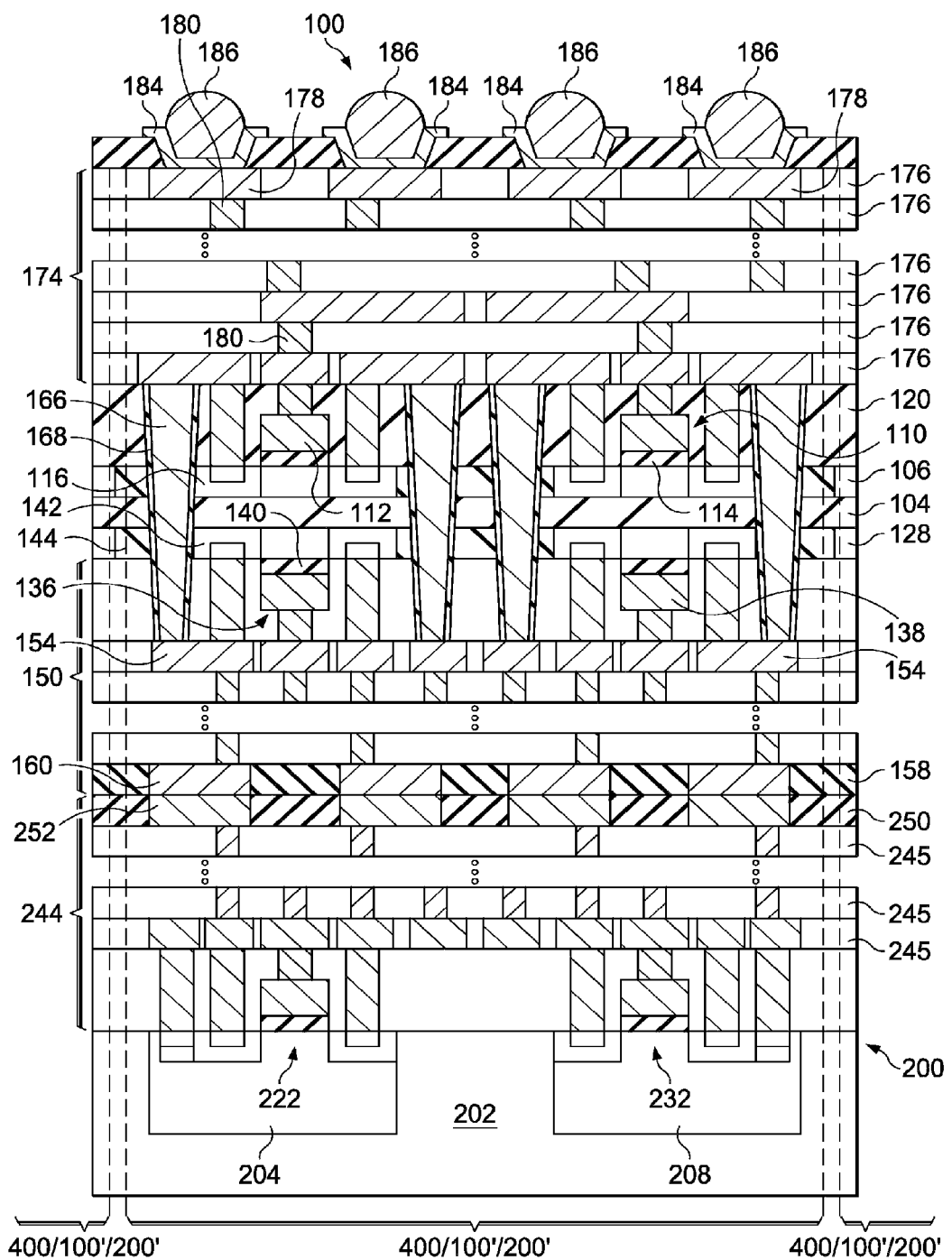
Figure 14:
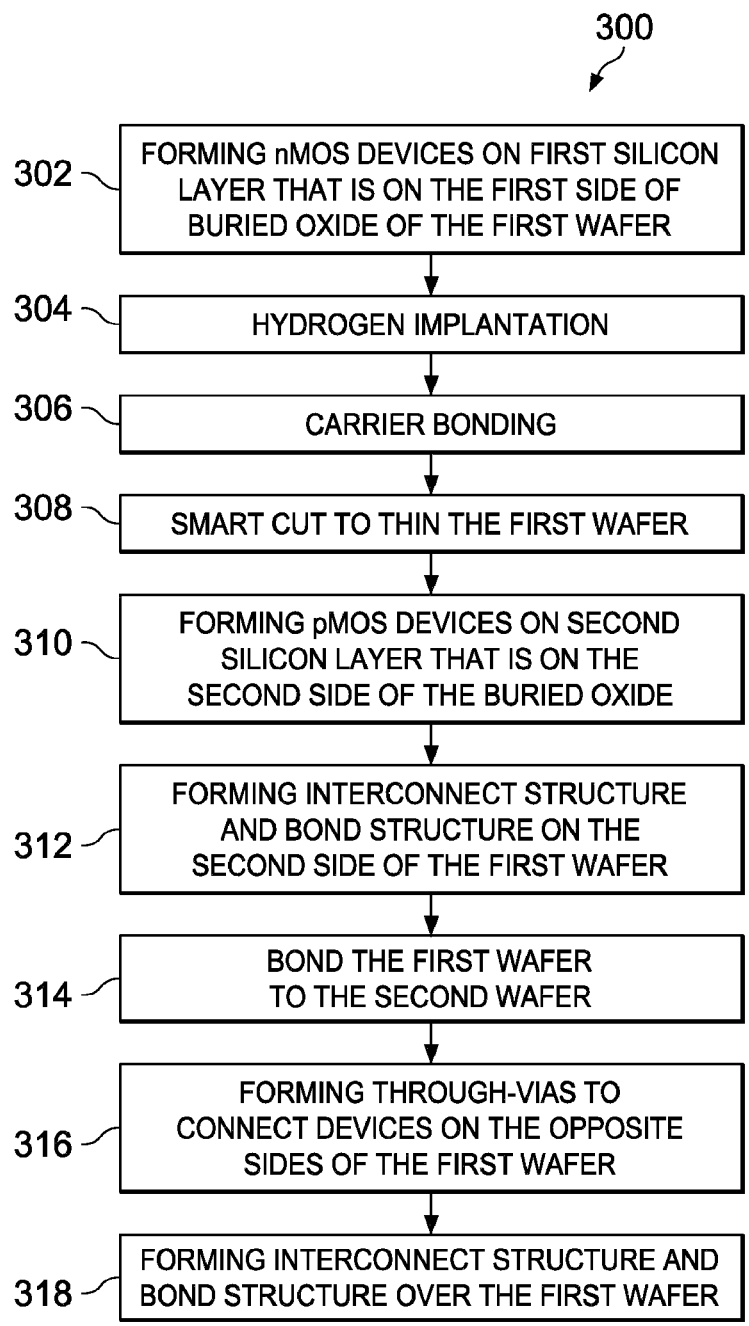
FIG. 14 illustrates a flow chart for forming a package in accordance with some embodiments.

FIG. 14 illustrates flow chart 300 for forming a package in accordance with some embodiments, wherein the process steps illustrated in FIGS. 1 through 13 are discussed referring to the steps shown in FIG. 14. FIGS. 1 through 8 are cross-sectional views of intermediate stages in the manufacturing of parts of a first chip/wafer in accordance with some exemplary embodiments. Referring to FIG. 1, wafer 100 is provided. Wafer 100 includes substrate 101, which is a Semiconductor-On-Insulator (SOI) substrate. Substrate 101 includes semiconductor layer 102, dielectric layer 104 over semiconductor layer 102, and semiconductor layer 106 over dielectric layer 104. Dielectric layer 104 may be formed of silicon oxide, and hence is referred to as Buried Oxide (BOX) layer 104, although it may also be formed of other dielectric materials.

Semiconductor layers 102 and 106 either have different compositions (for example, including different elements), and/or have different crystal surface orientations. In accordance with some embodiments, one of semiconductor layers 102 and 106 has the characteristics preferred for forming NMOS transistors, and less preferred for forming PMOS transistors, and the other one of semiconductor layers 102 and 106 has the characteristics preferred for forming PMOS transistors, and less preferred for forming NMOS transistors.

In some embodiments, semiconductor layers 102 and 106 are crystalline silicon layers that have different crystalline orientations. In some exemplary embodiments, semiconductor layer 106 is formed of crystalline silicon having a (100) surface orientation, and semiconductor layer 102 is formed of crystalline silicon having a (110) surface orientation. Accordingly, semiconductor layer 106 is preferred for forming NMOS transistors, and less preferred for forming PMOS transistors, while semiconductor layer 102 is preferred for forming PMOS transistors, and less preferred for forming NMOS transistors. In alternative embodiments, one or both of the semiconductor layers 102 and 106 is formed of a semiconductor material that is different from crystalline silicon, such as silicon germanium, silicon carbon, III-V compound semiconductors, or the like. In some embodiments, semiconductor layer 106 is lightly doped with a p-type impurity such as boron, indium, or the like, to a p-type impurity concentration between about $1E14/cm^3$ and about $1E17/cm^3$.

BOX layer 104, although referred to as an oxide layer, may be a non-oxide dielectric layer. For example, BOX layer 104 may comprise a silicon-containing dielectric material such as silicon nitride, silicon oxynitride, or the like, with its thickness denoted as T1. Semiconductor layer 102 and BOX layer 104 may be in direct contact with each other, and semiconductor layer 106 and BOX layer 104 may be in direct contact with each other. In some embodiments, the bonds between semiconductor layer 102 and BOX layer 104 include silicon-to-oxide bonds, and the bonds between semiconductor layer 106 and BOX layer 104 include silicon-to-oxide bonds.

Figure 2:
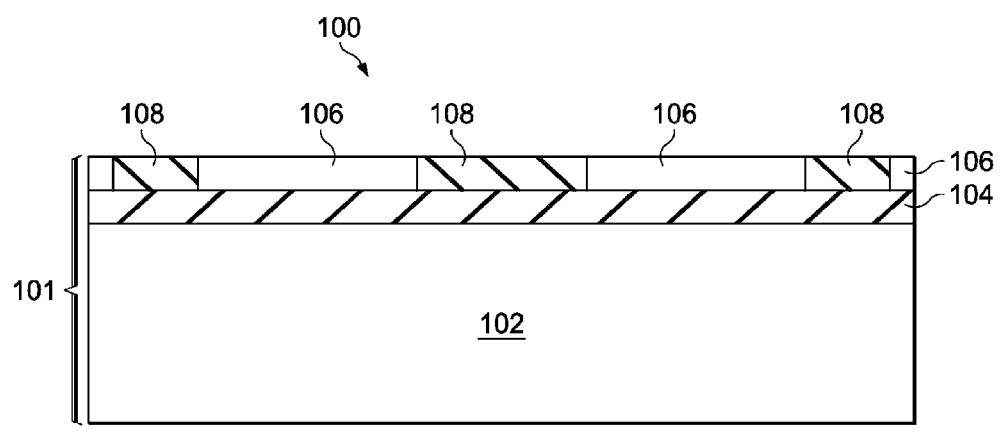

Next, referring to FIG. 2, isolation regions 108 are formed in semiconductor layer 106. Isolation regions 108 may be Shallow Trench Isolation (STI) regions that extend from the top surface of semiconductor layer 106 into semiconductor layer 106. STI regions 108 may also have bottoms contacting the top surface of BOX layer 104. STI regions 108 may comprise silicon oxide, and may be formed by etching semiconductor layer 106 to form recesses, and then filling the recesses with the respective dielectric material.

Figure 3:
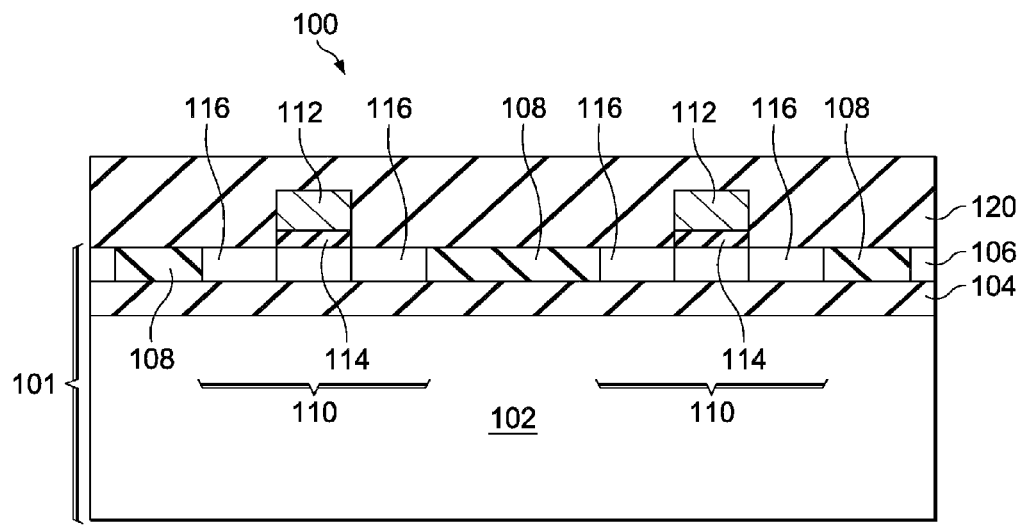

FIG. 3 illustrates the formation of NMOS transistors 110 (step 302 in FIG. 14). In some embodiments, NMOS transistor 110 includes gate electrode 112, gate dielectric 114, and source and drain regions 116, which are heavily doped n-type regions. Source/drain regions 116 may have an n-type impurity concentration in the range between about 1E19/cm$^3$ and 1E21/cm$^3$, although different impurity concentrations may be used. In some embodiments, source/drain regions 116 extend to the bottom surface of semiconductor layer 106 to contact the top surface of BOX layer 104. In alternative embodiments, source/drain regions 116 extend to an intermediate level of semiconductor layer 106. In accordance with some embodiments, semiconductor layer 106 is used for forming NMOS transistors, and no PMOS transistors are formed on semiconductor layer 106. In accordance with alternative embodiments, a small percentage, for example, less than about 5 percent (or less than about one percent) of all MOS transistors on semiconductor layer 106 are PMOS transistors, and others are NMOS transistors. These PMOS transistors may be the transistors that do not demand high performance.

Dielectric layer 120 is formed over NMOS transistors 110. A planarization such as a grinding may be performed to level the top surface of dielectric layer 120. In some embodiments, dielectric layer 120 is a sacrificial layer that is to be replaced in subsequent steps. In alternative embodiments, dielectric layer 120 includes Contact Etch Stop Layer (CESL) and Inter-Layer Dielectric (ILD) over the CESL, which CESL and ILD are left in the final package. Dielectric layer 120 may comprise silicon carbide, silicon oxide, silicon nitride, Phospho-Silicate Glass (PSG), Boro-Silicate Glass (BSG), Boron-Doped Phospho-Silicate Glass (BPSG), Tetraethyl Orthosilicate (TEOS) oxide, or multi-layers thereof.

Figure 4:
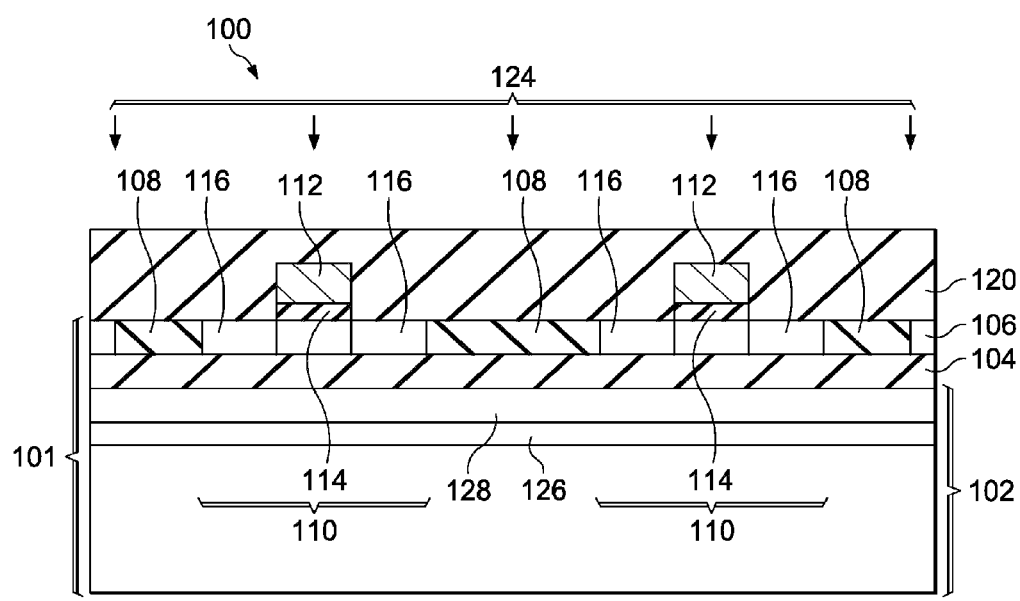

Referring to FIG. 4, hydrogen implantation 124 is performed to implant hydrogen ions into semiconductor layer 102 (step 304 in FIG. 14), so that hydrogen-concentrated layer 126 is formed in semiconductor layer 102. The implantation is performed from the topside (the side facing up in FIG. 4) of wafer 100 in some embodiments. Hydrogen-concentrated layer 126 extends into, and is spaced apart from, the bottom surface of BOX layer 104 by silicon layer 128. Although silicon layer 128 includes some of the hydrogen ions/atoms that are left in silicon layer 128 when hydrogen ions penetrate through silicon layer 128, the concentration of hydrogen ions in silicon layer 128 is significantly lower than in hydrogen-concentrated layer 126.

Figure 5:
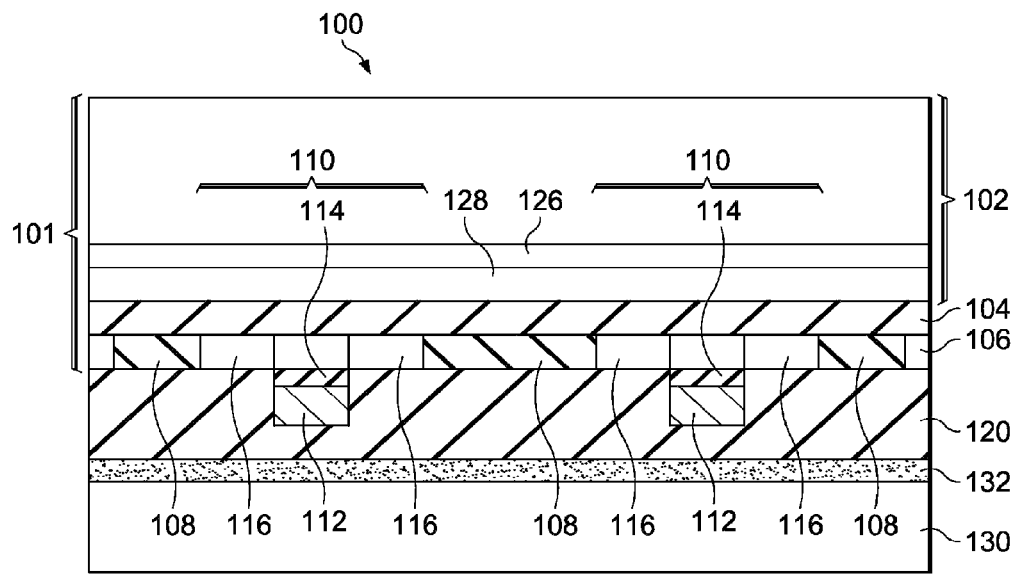

After the hydrogen implantation, wafer 100 is mounted on carrier 130 (step 306 in FIG. 14), as shown in FIG. 5. The side of wafer 100 with NMOS transistors 110 faces toward carrier 130. Carrier 130 may be a glass carrier, a ceramic carrier, or the like. In some embodiments, wafer 100 is mounted on carrier 130 through adhesive 132, which may be an Ultra Violet (UV) glue.

Figure 6:
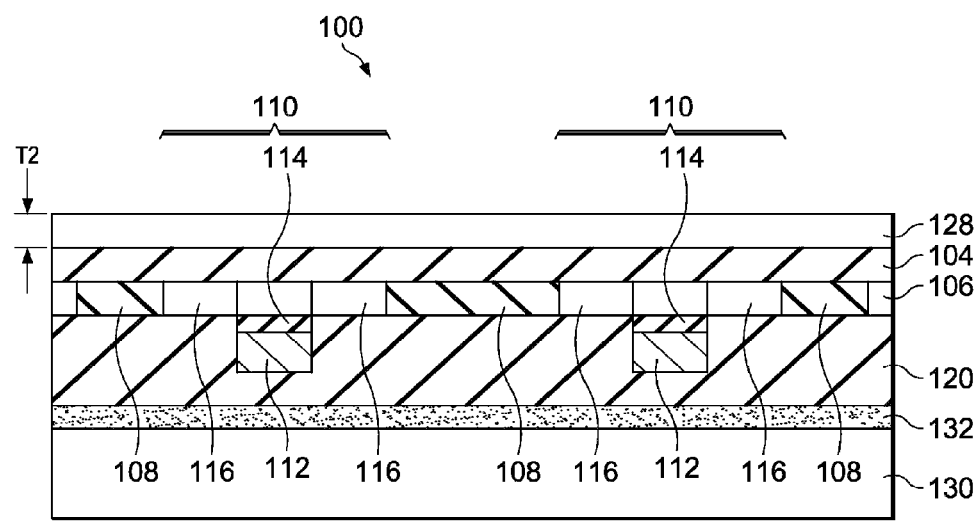

Next, wafer 100 is cleaved to separate the portion overlying hydrogen-concentrated layer 126 and the portion underlying hydrogen-concentrated layer 126 (step 308 in FIG. 14), so that semiconductor layer 102 is thinned. FIG. 6 illustrates the resulting structure. The respective method is sometimes referred to as a smart cut, which may include annealing wafer 100 at an elevated temperature such as about 350° C. to about 450° C., and/or applying sideway mechanical forces in the directions parallel to the top surface of wafer 100. After the smart cut, a planarization such as a Chemical Mechanical Polish (CMP) is performed to remove the remaining hydrogen-concentrated layer 126, and to level the top surface of semiconductor layer 128. As a result, semiconductor layer 128 is left over BOX layer 104. In some exemplary embodiments, semiconductor layer 128 has thickness T2 smaller than about 3 μm.

Figure 7:
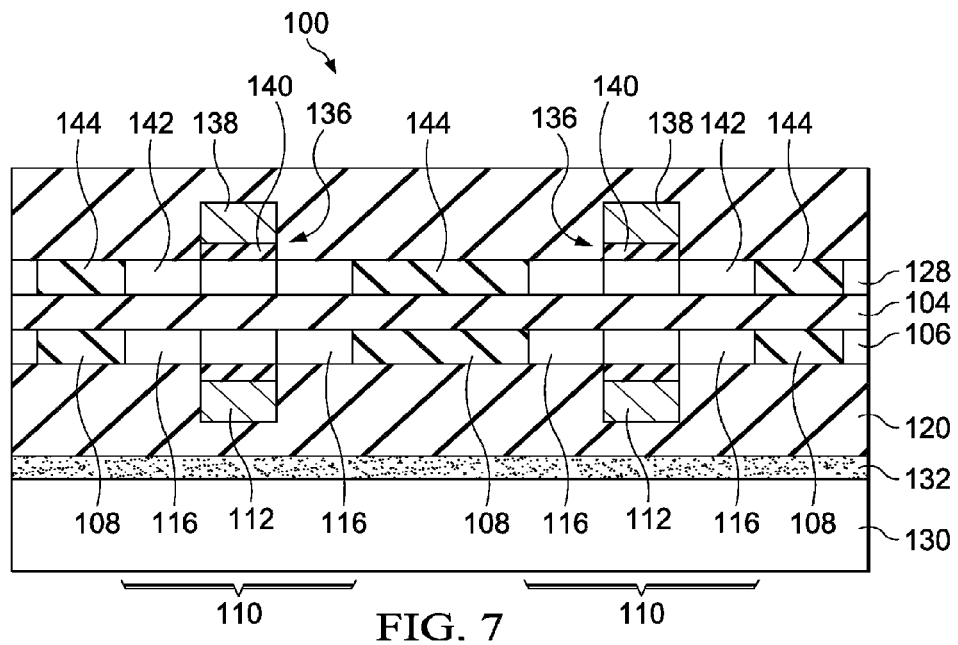

Next, referring to FIG. 7, isolation regions (such as STI regions) 144 are formed in semiconductor layer 128. STI regions 144 may extend from the top surface of semiconductor layer 128 to the top surface of BOX layer 104 in some embodiments. PMOS transistors 136 are also formed (step 310 in FIG. 14) on semiconductor layer 128. PMOS transistors 136 may include gate electrodes 138, gate dielectrics 140, and source and drain regions 142, which are heavily doped p-type regions. Source/drain regions 142 may have a p-type impurity concentration in the range between about 1E19/cm$^3$ and 1E21/cm$^3$. In some embodiments, source/drain regions 142 extend to the bottom surface of semiconductor layer 128 to contact the top surface of BOX layer 104. In alternative embodiments, source/drain regions 142 extend to an intermediate level of semiconductor layer 128. In accordance with some embodiments, semiconductor layer 128 is for forming PMOS transistors, and no NMOS transistor is formed on semiconductor layer 128. In accordance with alternative embodiments, a small percentage, for example, less than about 5 percent (or less than about one percent) of all MOS transistors on semiconductor layer 128 are NMOS transistors. These NMOS transistors may be the transistors that do not demand high performance.

Figure 8:
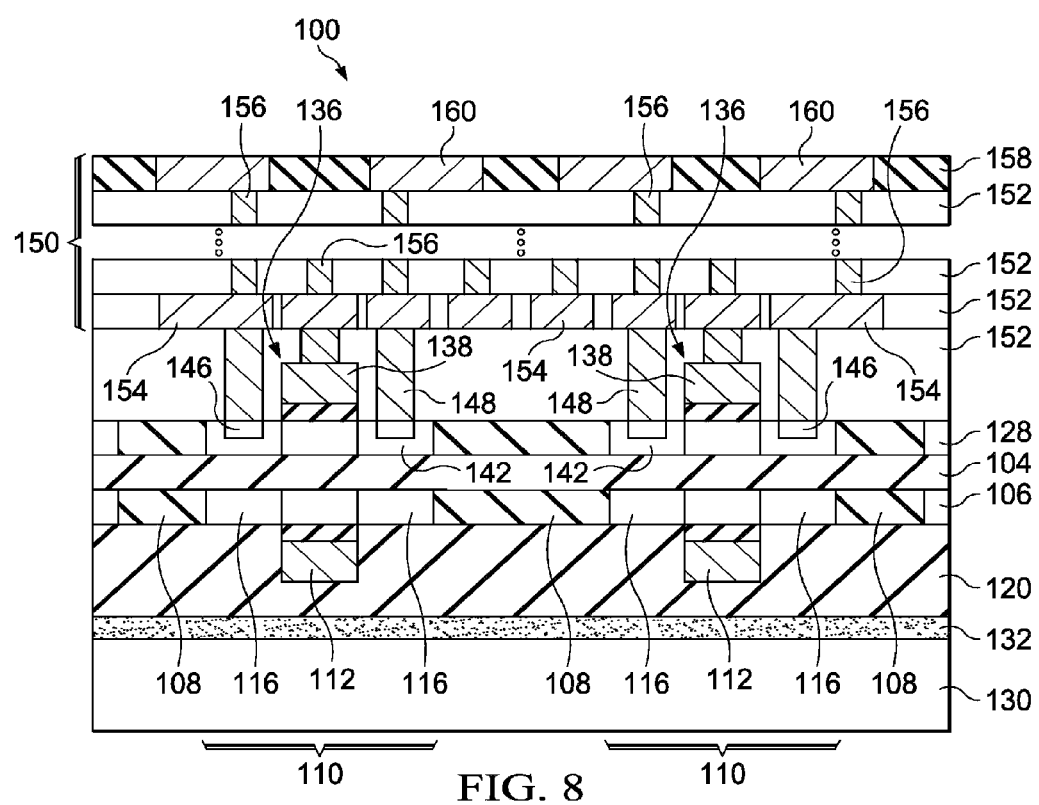

Referring to FIG. 8, source/drain silicide regions 146 are formed at the top surfaces of source/drain regions 142. Source/drain contact plugs 148 are formed over and in contact with source/drain silicide regions 146. Gate contact plugs, which are also marked using reference notations 148, are also formed to electrically connect to gate electrodes 138. Furthermore, interconnect structure 150 is formed (step 312 in FIG. 14). Interconnect structure 150 includes dielectric layers 152, and metal lines 154 and vias 156 formed in dielectric layers 152. Dielectric layers 152 may include an Inter-Layer Dielectric (ILD), Inter-Metal Dielectric (IMD) layers, passivation layers, and the like. The ILD layer and the IMD layers may be low-k dielectric layers in some embodiments, which have dielectric constants (k values) lower than about 3.5, lower than about 3.0, or lower than about 2.5. Dielectric layers 152 may also include non-low-k dielectric materials having dielectric constants (k values) equal to or greater than 3.8. Metal lines 154 and vias 156 may include copper, aluminum, nickel, tungsten, or alloys thereof. Metal lines 154 and vias 156 interconnect the integrated circuit devices such as transistors 136, and may electrically couple the integrated circuit devices to the overlying metal features 160.

In some embodiments, interconnect structure 150 further includes surface dielectric layer 158, which is formed at the surface of wafer 100. Surface dielectric layer 158 may be a silicon-containing dielectric layer, which may comprise silicon oxide ($SiO_2$), silicon oxynitride (SiON), silicon nitride (SiN), or the like. Metal pads 160 may be formed in surface dielectric layer 158, and may be electrically coupled to MOS transistors 136 through metal lines 154 and vias 156. Metal pads 160 may also be formed of copper, aluminum, or alloys thereof. The top surface of surface dielectric layer 158 and the top surfaces of metal pads 160 may be substantially coplanar with each other.

Figure 9:
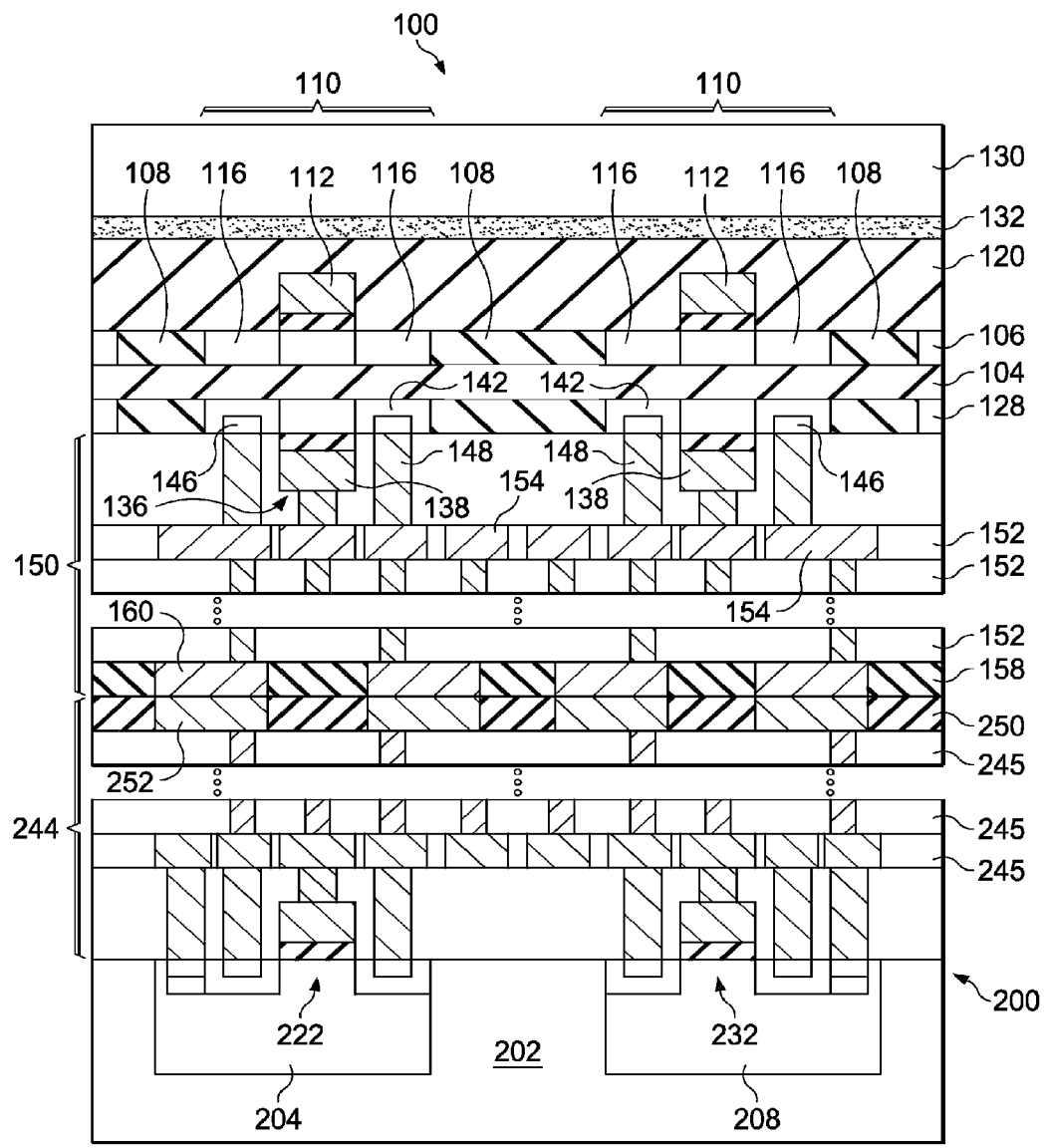
FIGS. 9 through 13 are cross-sectional views of intermediate stages in the bonding of the first chip/wafer to a second chip/wafer and the continued formation of the first chip/wafer in accordance with some exemplary embodiments.

FIG. 9 illustrates the bonding of wafer 100 to wafer 200 (step 314 in FIG. 14). Wafer 200 may be selected from a device wafer, an interposer wafer, and the like. In the illustrated FIG. 9, wafer 200 includes substrate 202, P-well region 204, N-well region 208, active devices 222/232 (which may include NMOS and PMOS transistors), dielectric layers 245, and interconnect structure 244, which include metal lines and vias in dielectric layers. Interconnect structure 244 may also include surface dielectric layer 250 and metal pads 252 as surface features.

Figure 10:
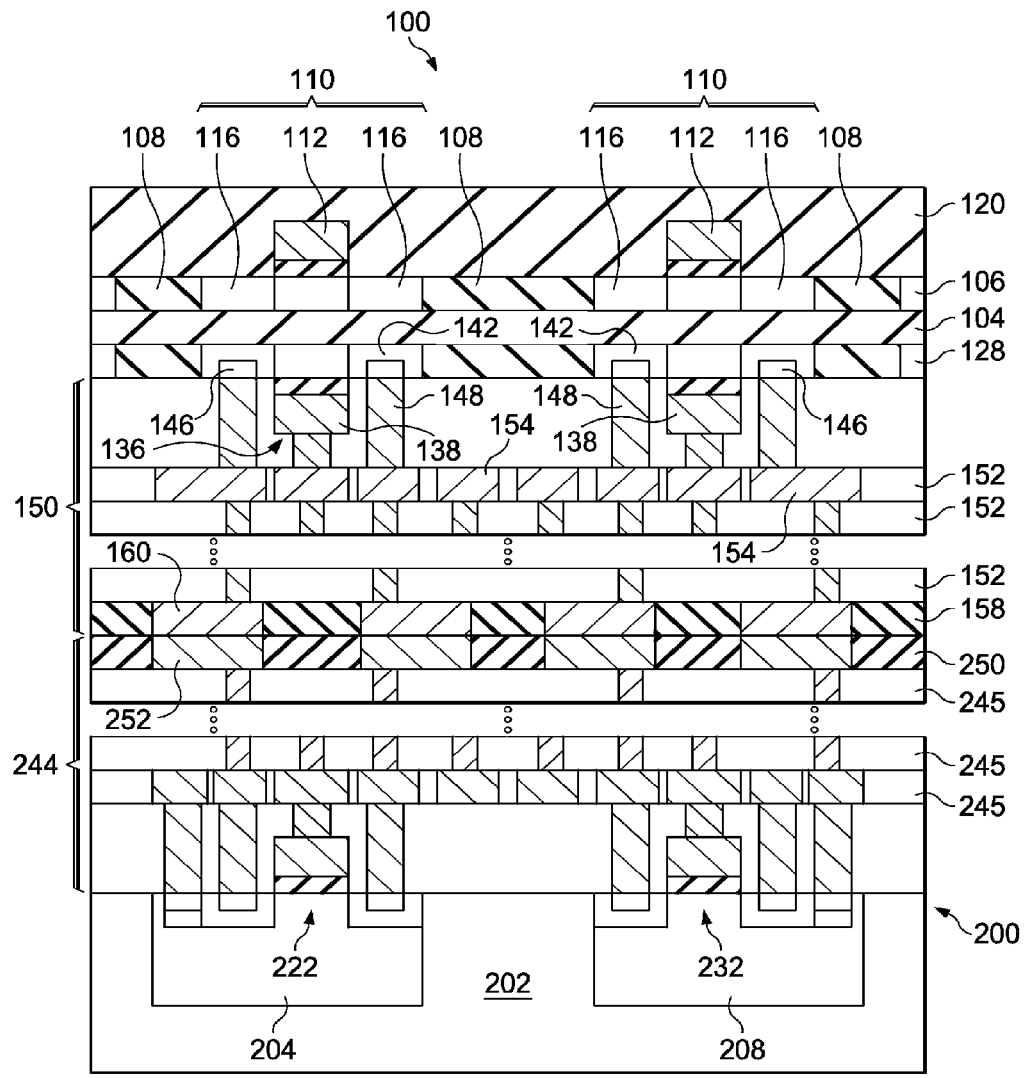
Figure 11:
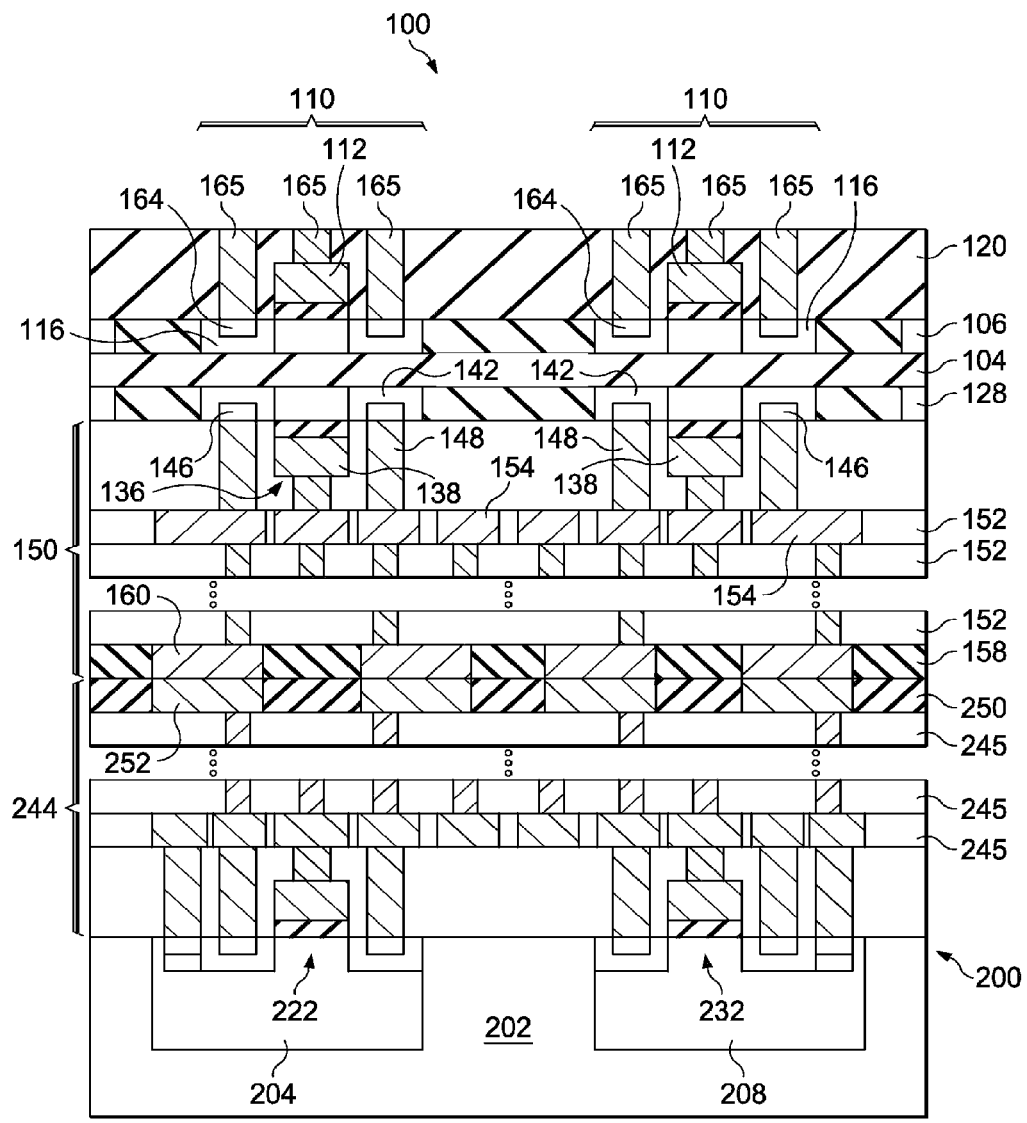

Carrier 130 and glue layer 132 are then removed, and the respective structure is shown in FIG. 10. Dielectric layer 120 is thus exposed. In the embodiments dielectric layer 120 is a sacrificial layer, dielectric layer 120 is removed, and is replaced with a CESL and an ILD (also denoted as 120). Otherwise, dielectric layer 120 is left un-removed, as also shown in FIG. 10. Next, as shown in FIG. 11, source/drain silicide regions 164 are formed at the top surfaces of source/drain regions 116, and contact plugs 165 are formed over and in contact with source/drain silicide regions 164, and to connect to gate electrodes 112. Contact plugs 165 penetrate through dielectric layer 120, which may include a CESL and an ILD in some embodiments.

Figure 12:
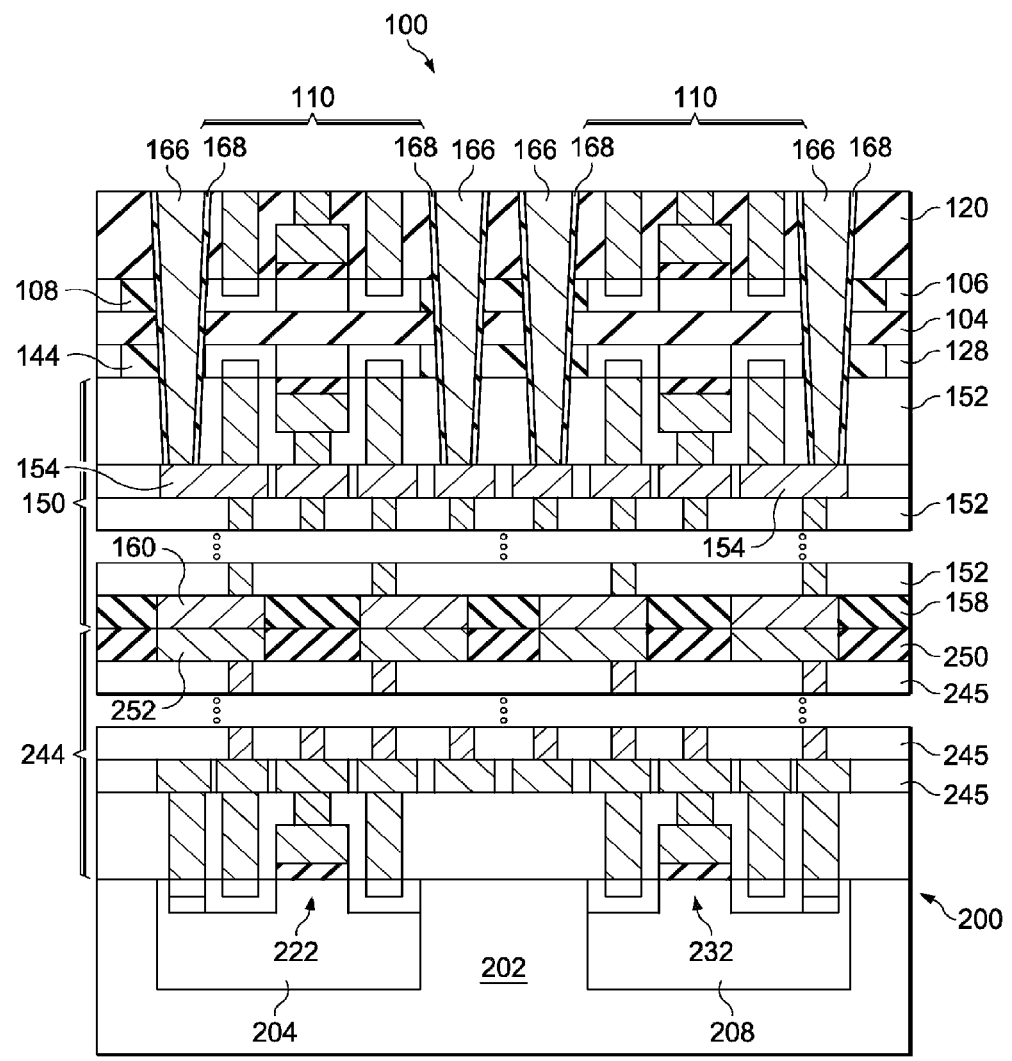

Referring to FIG. 12, Inter-Layer Vias (ILV) 166 are formed to electrically connect to metal line/pads 154 (step 316 in FIG. 14). Throughout the description, ILVs 166 are also referred to as through-vias. Isolation layer 168 may be formed to encircle each of ILVs 166, so that ILVs 166 are electrically decoupled from semiconductor layers 106 and 128. Although FIG. 12 illustrates that ILVs 166 penetrate through STI regions 108 and 144, some or all of ILVs 166 may also penetrate through semiconductor layers 106 and 128 without going through STI regions. In the embodiments all ILVs 166 penetrates through STI regions 108 and 144, but not through semiconductor layers 106 and 128, isolation layers 168 may not be formed (although they can also be formed). In these embodiments, the sidewalls of ILVs 166 are in contact with STI regions 108 and 144. The process for forming ILVs 166 may include etching dielectric layer 120, semiconductor layers 128 and 106 (and/or STI regions 108/144), BOX layer 104, and dielectric layer(s) 152 to form openings, filling an isolation layer in the openings, and removing the bottom portions of the isolation layer in the openings to expose metal lines/pads 154. A metallic material is then filled into the openings, followed by a CMP. The remaining portions of the isolation layer and the metallic material in the openings form isolation layers 168 and ILVs 166, respectively.

FIG. 13 illustrates the formation of interconnect structure 174 (step 318 in FIG. 14). Interconnect structure 174 may include dielectric layers 176, and metal lines 178 and vias 180 in dielectric layers 176. Dielectric layers 176 may include low-k dielectric layers, passivation layers, and the like. The low-k dielectric layers may have dielectric constants (k values) lower than about 3.5, lower than about 3.0, or lower than about 2.5. Dielectric layers 176 may also include non-low-k dielectric materials having dielectric constants (k values) equal to or greater than 3.8. Metal lines 178 and vias 180 may include copper, aluminum, nickel, tungsten, or alloys thereof. Through ILVs 166, the devices on the opposite sides of BOX layer 104 are interconnected to form an integrated circuit.

In some embodiments, Under-Bump Metallurgies (UBMs) 184 are formed, and electrical connectors 186 are formed on UBMs 184. Electrical connectors 186 may include solder balls, copper bumps, or the like. Electrical connectors 186 may be electrically coupled to the integrated circuit devices (such as NMOS transistors 110 and PMOS transistors 136) in wafer 100 and the integrated circuit devices 222/232 in wafer 200, for example, through ILVs 166.

After the formation of the bonded wafers 100 and 200, a die-saw may be performed, and wafer 100 and 200 are sawed into a plurality of packages 400, each including one of chips 100' in wafer 100, and one of chips 200' in wafer 200. Packages 400 may then be bonded to other package components such as interposers, package substrates, printed circuit boards, or the like.

As shown in FIG. 13, NMOS transistors 110 and PMOS transistors 136 are formed on the semiconductor layers that are bonded to the opposite surfaces of the same BOX layer 104. In these embodiments, BOX layer 104 may be formed of a homogenous material, with no layered structure such as metal layers and vias embedded therein. Furthermore, except ILVs 166 and isolation layers 168, there may not exist other conductive materials in BOX layer 104. ILVs 166 and isolation layers 168 may have substantially straight edges that are substantially perpendicular to the top surface and the bottom surfaces of BOX layer 104. ILVs 166 and isolation layers 168 continuously penetrate through semiconductor layers 106 and 128 and BOX layer 104, with no discontinuity therein.

In the above-discussed embodiments, as shown in FIG. 1, semiconductor layer 106, which has the (100) surface orientation, is over BOX layer 104, and is used for forming NMOS transistors. Semiconductor layer 102 and the respective semiconductor layer 128 having the (110) surface orientation, on the other hand, are used for forming PMOS transistors. In alternative embodiments, semiconductor layer 106 may have the (110) surface orientation, and is used for forming PMOS transistors with no NMOS transistors thereon. Semiconductor layer 102 and the respective semiconductor layer 128 cut from it, on the other hand, may have the (100) surface orientation, and are used for forming NMOS transistors with no PMOS transistors thereon.

The embodiments of the present disclosure have several advantageous features. PMOS transistors and NMOS transistors are formed on different semiconductor layers, and are inter-coupled through ILVs to form integrated circuits. Accordingly, the semiconductor layers may be selected and/or tuned to improve the performance of the respective PMOS transistors and NMOS transistors formed thereon. For example, the crystalline orientations and the strains in the semiconductor layers may be tuned to improve the performance of the respective MOS transistors.

In accordance with some embodiments, a chip includes a dielectric layer having a top surface and a bottom surface, a first semiconductor layer overlying and bonded to the top surface of the dielectric layer, and a first MOS transistor of a first conductivity type. The first MOS transistor includes a first gate dielectric overlying and contacting the first semiconductor layer, and a first gate electrode overlying the first gate dielectric. A second semiconductor layer is underlying and bonded to the bottom surface of the dielectric layer. A second MOS transistor of a second conductivity type opposite to the first conductivity type includes a second gate dielectric underlying and contacting the second semiconductor layer, and a second gate electrode underlying the second gate dielectric.

In accordance with other embodiments, an integrated circuit structure includes an oxide layer having a top surface and a bottom surface, a first silicon layer overlying and bonded to the oxide layer, and a second silicon layer underlying and bonded to the oxide layer. The first silicon layer has a (100) surface orientation, and the second silicon layer has a (110) surface orientation. An NMOS transistor includes a first gate dielectric overlying the first silicon layer, a first gate electrode overlying the first gate dielectric, and a first source/drain region in the first silicon layer. A second silicon layer is underlying and bonded to the oxide layer, wherein the second silicon layer has a (110) surface orientation. A PMOS transistor includes a second gate dielectric underlying the second silicon layer, a second gate electrode underlying the second gate dielectric, and a second source/drain region in the second silicon layer. A through-via penetrates through the oxide layer, the first silicon layer, and the second silicon layer.

In accordance with yet other embodiments, a method includes forming a first transistor at a top surface of an SOI substrate, wherein the SOI substrate includes a first semiconductor layer, a dielectric layer over and bonded to the first semiconductor layer, and a second semiconductor layer over and bonded to the dielectric layer. The first transistor is formed on the second semiconductor layer. The method further includes thinning the first semiconductor layer, and forming a second transistor on the first semiconductor layer. The first transistor and the second transistor are of opposite conductivity types. A through-via penetrates through the first semiconductor layer, the dielectric layer, and the second semiconductor layer.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
    forming a first transistor at a top surface of a Semiconductor-On-Insulator (SOI) substrate, wherein the SOI substrate comprises:
        a dielectric layer;
        a first semiconductor layer;
        a second semiconductor layer, wherein the first semiconductor layer and the second semiconductor layer are bonded to opposite surfaces of the dielectric layer, and the first transistor is formed on the second semiconductor layer;
    thinning the first semiconductor layer;
    forming a second transistor on the first semiconductor layer, wherein the first transistor and the second transistor are of opposite conductivity types; and
    forming a through-via penetrating through the first semiconductor layer, the dielectric layer, and the second semiconductor layer.

2. The method of claim 1, wherein the thinning the first semiconductor layer comprises:
    implanting hydrogen ions into the first semiconductor layer to form a hydrogen-concentrated layer in the first semiconductor layer; and
    cleaving the first semiconductor layer along the hydrogen-concentrated layer to separate the first semiconductor layer into two layers.

3. The method of claim 1, wherein the first semiconductor layer and the second semiconductor layer have different surface orientations.

4. The method of claim 3, wherein the second semiconductor layer has a (100) surface orientation, and the first transistor is an n-type transistor, and wherein the first semiconductor layer has a (110) surface orientation, and the second transistor is a p-type transistor.

5. The method of claim 4 further comprising forming additional transistors on the first semiconductor layer and the second semiconductor layer, wherein all transistors formed on the top surface of the first semiconductor layer are p-type transistors, and all transistors formed on a top surface of the second semiconductor layer are n-type transistors.

6. The method of claim 1, wherein at a time after the through-via is formed, no transistor that is of a conductivity type opposite to a conductivity type of the first transistor is formed on the second semiconductor layer, and wherein no transistor that is of a conductivity type opposite to a conductivity type of the second transistor is formed on the first semiconductor layer.

7. The method of claim 1 further comprising forming a first interconnect structure and a second interconnect structure on opposite sides of the SOI substrate, wherein the first interconnect structure and the second interconnect structure are electrically inter-coupled by the through-via.

8. The method of claim 1, wherein the SOI substrate and the through-via are comprised in a first chip, and wherein the method further comprises bonding a second chip to the first chip.

9. The method of claim 1 further comprising forming a first isolation region penetrating through the first semiconductor layer, wherein the through-via further penetrates through the first isolation region.

10. The method of claim 9 further comprising forming a second isolation region penetrating through the second semiconductor layer, wherein the through-via further penetrates through the second isolation region.

11. A method comprising:
    thinning a first semiconductor layer in a Semiconductor-On-Insulator (SOI) substrate, wherein the SOI substrate comprises:
        the first semiconductor layer;
        a dielectric layer having a first surface bonded to the first semiconductor layer, wherein the dielectric layer is a continuous layer with no distinguishable interface therein; and
        a second semiconductor layer bonded to a second surface of the dielectric layer;
    forming a first transistor and a second transistor on the first semiconductor layer and the second semiconductor layer, respectively; and forming a through-via penetrating through the first semiconductor layer, the dielectric layer, and the second semiconductor layer, wherein the through-via electrically couples the first transistor to the second transistor.

12. The method of claim 11 further comprising forming a first isolation region penetrating through the first semiconductor layer, with the first isolation region contacting the dielectric layer, wherein the through-via further penetrates through the first isolation region.

13. The method of claim 12 further comprising forming a second isolation region penetrating through the second semiconductor layer, with the second isolation region contacting the dielectric layer, wherein the through-via further penetrates through the second isolation region.

14. The method of claim 11 further comprising:
forming a first inter-layer dielectric, with a first gate of the first transistor located in the first inter-layer dielectric; and
forming a second inter-layer dielectric, with a second gate of the second transistor located in the second inter-layer dielectric, wherein the through-via penetrates through both the first inter-layer dielectric and the second inter-layer dielectric.

15. The method of claim 11, wherein the thinning the first semiconductor layer comprises:
implanting hydrogen ions into the first semiconductor layer to form a hydrogen-concentrated layer in the first semiconductor layer; and
cleaving the first semiconductor layer along the hydrogen-concentrated layer to separate the first semiconductor layer into two layers, wherein the first transistor is formed at a surface of the first semiconductor layer, with the surface of the first semiconductor layer generated by the cleaving.

16. The method of claim 11 further comprising:
forming a first transistor on the first semiconductor layer; and
forming a second transistor on the second semiconductor layer, wherein the first transistor and the second transistor are of opposite conductivity types, and the first semiconductor layer and the second semiconductor layer have different surface orientations.

17. A method comprising:
forming first isolation regions in a first semiconductor layer of a Semiconductor-On-Insulator (SOI) substrate, wherein the SOI substrate comprises:
a dielectric layer;
a first semiconductor layer;
a second semiconductor layer, wherein the first semiconductor layer and the second semiconductor layer are bonded to opposite surfaces of the dielectric layer, wherein the first isolation regions penetrate through the first semiconductor layer to contact the dielectric layer;
forming second isolation regions penetrating through the second semiconductor layer to contact the dielectric layer;
forming a through-via penetrating through the dielectric layer, a first one of the first isolation regions, and a second one of the second isolation regions;
forming a first transistor on the first semiconductor layer; and
forming a second transistor on the second semiconductor layer, wherein the first transistor and the second transistor are of opposite conductivity types, and the first semiconductor layer and the second semiconductor layer have different surface orientations.

18. The method of claim 17, wherein the first semiconductor layer has a first surface and a second surface opposite to the first surface, wherein the second surface contacts the dielectric layer, and the first surface is substantially level with a surface of the first isolation regions.

19. The method of claim 18, wherein the second semiconductor layer has a third surface and a fourth surface opposite to the third surface, wherein the fourth surface contacts the dielectric layer, and the third surface is substantially level with a surface of the second isolation regions.

20. The method of claim 17 further comprising, when both the first semiconductor layer and the second semiconductor layer are bonded to the dielectric layer, thinning the first semiconductor layer.

* * * * *